(12) United States Patent
Morris

(10) Patent No.: US 7,013,161 B2
(45) Date of Patent: Mar. 14, 2006

(54) PEAK POWER REDUCTION USING WINDOWING AND FILTERING

(75) Inventor: Bradley John Morris, Ottawa (CA)

(73) Assignee: Nortel Networks Limited, St. Laurent (*) Notice: Subject to any disclaimer, the term of this patent is extended or adjusted under 35 U.S.C. 154(b) by 511 days.

(21) Appl. No.: 10/254,499

(22) Filed: Sep. 24, 2002

(65) Prior Publication Data

US 2004/0203430 A1 Oct. 14, 2004

(51) Int. Cl.
*H04B 7/00* (2006.01)

(52) U.S. Cl. .................... 455/522; 455/108; 455/126; 455/127.1; 455/69; 455/571; 375/285; 375/261; 375/296; 375/297; 375/298

(58) Field of Classification Search ............... 455/522, 455/108, 69, 571, 126, 127.1; 375/285, 261, 375/296, 297, 298

See application file for complete search history.

(56) References Cited

U.S. PATENT DOCUMENTS

| | | | | |
|---|---|---|---|---|
| 5,287,387 A | * | 2/1994 | Birchler | 375/296 |
| 5,638,403 A | * | 6/1997 | Birchler et al. | 375/296 |
| 5,694,431 A | * | 12/1997 | McCoy | 375/295 |
| 6,236,864 B1 | * | 5/2001 | McGowan et al. | 455/522 |

OTHER PUBLICATIONS

NEE, et al., "Reducing the Peak-To-Average Power Ratio of OFDM" VTC '98; pp 2072-2076; 1998 IEEE.

* cited by examiner

*Primary Examiner*—Nick Corsaro
*Assistant Examiner*—Sanh Phu
(74) *Attorney, Agent, or Firm*—Slater & Matsil, L.L.

(57) ABSTRACT

Large signal peaks (for example, peaks 105 and 110) can dramatically increase the cost of a communications device by requiring high grade power amplifiers. Peak reduction can reduce the large peaks at a cost of increasing spurious emissions. A circuit (for example, circuit 500) combining a scaling window peak reducing unit (for example, unit 507) and a filter (for example, filter 509) can effectively reduce the signal peaks without significantly increasing spurious emissions.

34 Claims, 7 Drawing Sheets

PEAK POWER REDUCTION USING WINDOWING AND FILTERING

FIELD OF THE INVENTION

This invention relates generally to communications systems and particularly to reducing the peak to average power ratio in such communications systems.

BACKGROUND OF THE INVENTION

In a large number of communications systems, and particularly wireless communications systems, the peak-to-average power ratio (PAP) plays a crucial role in determining the overall cost and performance of the infrastructure components, such as Base Transceiver Stations ("BTS") for wireless systems. This is due to the fact that the BTS uses a power amplifier to amplify a signal prior to transmission. With a high PAP, the power amplifier used in the communications system must have sufficient performance headroom to amplify the entire signal without clipping any portion of the signal. Since the power amplifier is one of the most expensive components in a wireless communications network, it is desirable to reduce the PAP as much as possible without excessively distorting the signal so that lower performance (lower power and hence lower cost) power amplifiers may be used. The problem is further complicated in communications systems such as Code-Division Multiple Access (CDMA) where the PAP will actually increase as the number of users increase.

One solution to an excessively high PAP is to clip the signal peaks if they exceed a certain magnitude threshold, replacing the signal peak with a value equal to the magnitude threshold. This is known as "hard clipping" and is effective in reducing the PAP. Unfortunately, hard clipping introduces emissions lying outside of the frequency band of the signals. These emissions are commonly referred to as spurious out-of-band emissions. These spurious emissions can cause the communications system to fail adjacent and alternate channel emission specifications, which have strict signal power specifications. The spurious emissions may be reduced through the use of filters that only pass the frequency band (in-band) signals and block the out-of-band emissions. However, the use of such filters introduces a problem of their own: peak re-growth. Peak re-growth is the re-growth of some (or all) of the clipped signal peaks and is caused by the smoothing of the sharp transitions (which were caused by the hard clipping) by filtering.

In U.S. Pat. No. 6,236,864, a solution involving multiple iterations of hard clipping and filtering is presented to solve the problems of out-of-band spurious emissions and peak re-growth. The premise is that the peak re-growth does not result in signals with peaks as large as the original signal peaks, and, therefore, each time the signal is clipped and filtered, the output signal has a smaller PAP than the input signal. However, the multiple iterations can introduce an unacceptable amount of latency into the communications system if the number of iterations is large and the filters themselves can be expensive and hard to implement.

A proposed solution for high PAP in Orthogonal Frequency Division Multiplexing (OFDM) communications systems involves the use of Gaussian scaling windows to scale the magnitudes of the signal peaks exceeding a specified threshold. The Gaussian windows do not perform hard clipping, rather, the Gaussian windows perform a softer type of clipping that does not result in sharp transitions and consequently does not result in as much spurious out-of-band emissions. The use of Gaussian windows however, trades reduction of signal peaks for degraded bit-error rate (BER) performance and increased out-of-band emissions.

The need has therefore arisen for a solution in communications systems with a high PAP that does not introduce a significant amount of latency into the communications system, increase spurious out-of-band emissions, or significantly degrade system performance.

SUMMARY OF THE INVENTION

In one aspect, the present invention provides a method for peak power reduction comprising the steps of measuring an input signal, detecting a signal peak with a magnitude exceeding a specified threshold, reducing the detected signal peak in the input signal via a scaling window, and filtering the peak reduced input signal.

In another aspect, the present invention provides a circuit comprising a peak detector having an input coupled to a signal input line, the peak detector containing circuitry to detect signal peaks exceeding a specified threshold, a scaling window adjustor circuit having an input coupled to the peak detector, the scaling window adjustor circuit containing circuitry to adjust a scaling window based on a signal peak magnitude provided by the peak detector, and an output to provide the adjusted scaling window.

In yet another aspect, the present invention provides a peak reduction circuit comprising a signal power calculator coupled to a signal input, the signal power calculator containing circuitry to determine a signal power from an input signal, a window clipper unit coupled to the signal power calculator, the window clipper unit containing circuitry to detect signal peaks with magnitudes exceeding a specified threshold and to provide an adjusted scaling window based on the magnitudes, a multiplier coupled to the signal input and the window clipper unit, the multiplier to produce a peak reduced signal by multiplying the signal input with the adjusted scaling window, and a filter unit coupled to the multiplier, the filter unit to filter the peak reduced signal to eliminate spurious emissions.

The present invention provides a number of advantages. For example, use of a preferred embodiment of the present invention rapidly reduces the PAP of a signal, therefore reducing the number of iterations required to satisfy strict spurious out-of-band emission standards. By reducing the number of iterations, a smaller amount of latency is introduced into the system.

Also, use of a preferred embodiment of the present invention allows the use of an inexpensive power amplifier. By reducing the cost of the power amplifier, a less expensive communications device is produced, therefore decreasing the cost to the manufacturer and increasing profitability.

Additionally, use of a preferred embodiment of the present invention provides better PAP reduction performance than existing PAP reduction schemes, therefore, the present invention can provide equivalent performance with lower implementation costs or better performance at a similar implementation cost.

BRIEF DESCRIPTION OF THE DRAWINGS

The above features of the present invention will be more clearly understood from consideration of the following descriptions in connection with accompanying drawings in which.

DETAILED DESCRIPTION OF ILLUSTRATIVE EMBODIMENTS

The making and use of the various embodiments are discussed below in detail. However, it should be appreciated that the present invention provides many applicable inventive concepts, which can be embodied in a wide variety of specific contexts. The specific embodiments discussed are merely illustrative of specific ways to make and use the invention, and do not limit the scope of the invention.

The discussion of a preferred embodiment of the present invention below will focus principally on a wireless cellular network that is adherent to Code Division Multiple Access (CDMA) technical standards such as CDMA, CDMA2000 and UTMS. The CDMA technical standard is specified in a document entitled "TIA/EIA Standard: Mobile Station— Base Station Compatibility Standard for Wideband Spread Spectrum Cellular Systems; ANSI/TIA/EIA-95-B-99", published February 1999, the CDMA2000 technical standard is specified in a document entitled "TIA/EIA Standard: Recommended Minimum Performance Standards for Base Stations Supporting Dual Mode Spread Spectrum Systems; TIA/EIA-97-D", published June 2001, while the UMTS technical standard is specified in a series of documents starting with a document entitled "$3^{rd}$ Generation Partnership Project; Technical Specification Group Services and System Aspects; $3^{rd}$ Generation Mobile System Release 5 Specifications (Release 5)", published March 2002. The technical standards are incorporated herein by reference. However, the present invention is not limited to applicability to CDMA wireless cellular networks. The present invention is applicable to other wireless communications systems such as ones that are based on Orthogonal Frequency Division Multiplexing (OFDM), Discrete Multi-Tone (DMT) and even has applications in wired networks and communications systems.

Figure 1A:
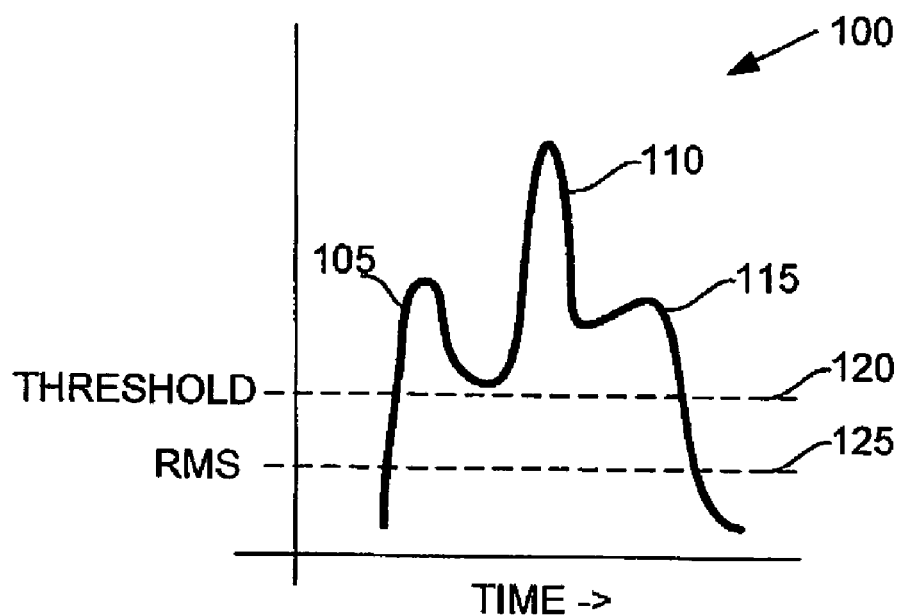
FIGS. 1a and 1b illustrate an exemplary signal with several signal peaks exceeding a specified threshold and the same signal after being hard clipped to the a level equal to the specified threshold.
Figure 1B:
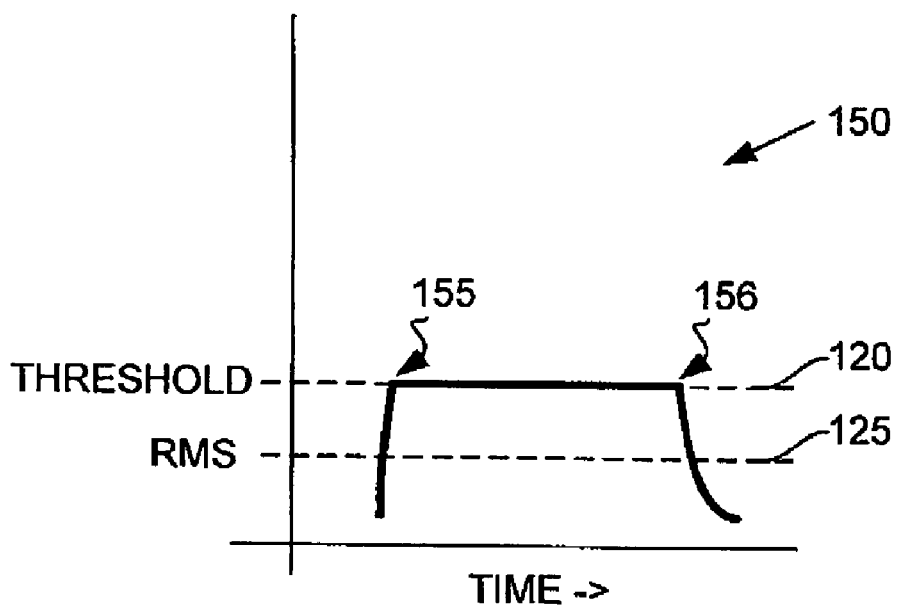

Referring now to FIGS. 1a and 1b, the diagrams illustrate an exemplary signal 100 in a communications system with signal peaks 105, 110, and 115, and the same signal after being hard clipped to a specified threshold value, displayed as a clipped signal 150. Each of the three signal peaks 105, 110, and 115 exceed a threshold, THRESHOLD, displayed as a first dashed line 120. A horizontal axis displays time increasing towards the right, while a vertical axis displays signal magnitude in an unspecified unit. The unit may be in volts, amperage, or dB. A second dashed line 125 represents the root-mean square value of the signal 100. Notice that the diagram does not display the entire signal 100 and that it is not necessarily to scale. It is the intent of the diagram to illustrate an exemplary signal with several signal peaks that exceed a threshold value and not to accurately illustrate an actual signal from a communications system.

As discussed earlier, one way to approach the problem that is presented by the large signal peaks is to simply perform what is known as a hard clip. When a signal is hard clipped, any portion of the signal that has a magnitude that exceeds a certain threshold is eliminated and replaced with a value that is equal to the threshold. A simplistic view would be to imagine that the signal is passed through a circuit that cuts off any portion of the signal above the threshold.

Figure 2:
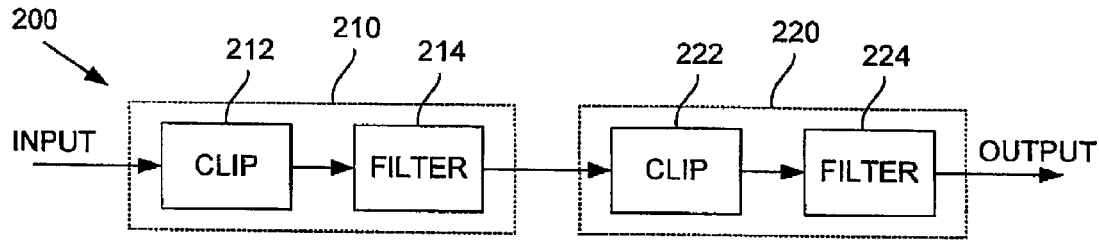
FIG. 2 illustrates a prior art two-stage clip and filter circuit.

Referring now to FIG. 2, the block diagram illustrates a prior art two-stage clip and filter circuit 200. The two-stage clip and filter circuit 200 features two clip and filter units 210 and 220. The two stages may be identical or they may be different, depending on the needs and desires of the engineer implementing the circuit 200. The clip and filter unit 210 has a clipping circuit 212 and a filter circuit 214. The clipping circuit 212 is used to eliminate portions of the signal that are above some specified threshold value while the filter circuit 214 is used to filter out any spurious out-of-band emissions that are introduced into the signal by the clipping circuit 212. A similar clipping circuit 222 and filter circuit 224 are present in the clip and filter unit 220.

Referring back to FIG. 1b, the diagram illustrates an exemplary signal 150 after being hard clipped by a clipping circuit. The exemplary signal 150 as displayed may be the output of a clipping circuit, for example, the clipping circuit 212. As discussed previously, the hard clipping simply eliminates any portion of the signal above some specified threshold, for example, THRESHOLD (displayed as the dashed line 120) and replaces the eliminated portions with a signal level equal to the specified threshold. As a result of the hard clipping, sharp corners may be introduced into the signal, for example, sharp corners 155 and 156. It is these sharp corners that introduce spurious out-of-band emissions into the signal.

Referring back to FIG. 2, it is common practice to pair a clipping circuit, for example, the clipping circuit 212, with a filter unit, for example, the filter unit 214, for the express purpose of reducing the amount of spurious out-of-band emissions. A filter unit may be designed to operate at a baseband frequency, in which case, the filter unit will likely be a low-pass filter, or at an intermediate frequency, in which case, the filter unit will likely be a band-pass filter. However, as discussed previously, the use of the filter unit to reduce the spurious out-of-band emissions tend to result in the re-growth of the signal peaks that were eliminated by the clipping circuit. The peak re-growth may be viewed as being the product of the rounding off of the hard corners in the signal and the ripples that may be present in the pass-band of the filter unit. Notice that while peak re-growth occurs, it is unlikely that the re-grown peak(s) are of the same magnitude as the peaks that were clipped. Nevertheless, the peaks that re-grew will have magnitudes that exceed the specified threshold.

Figure 3:
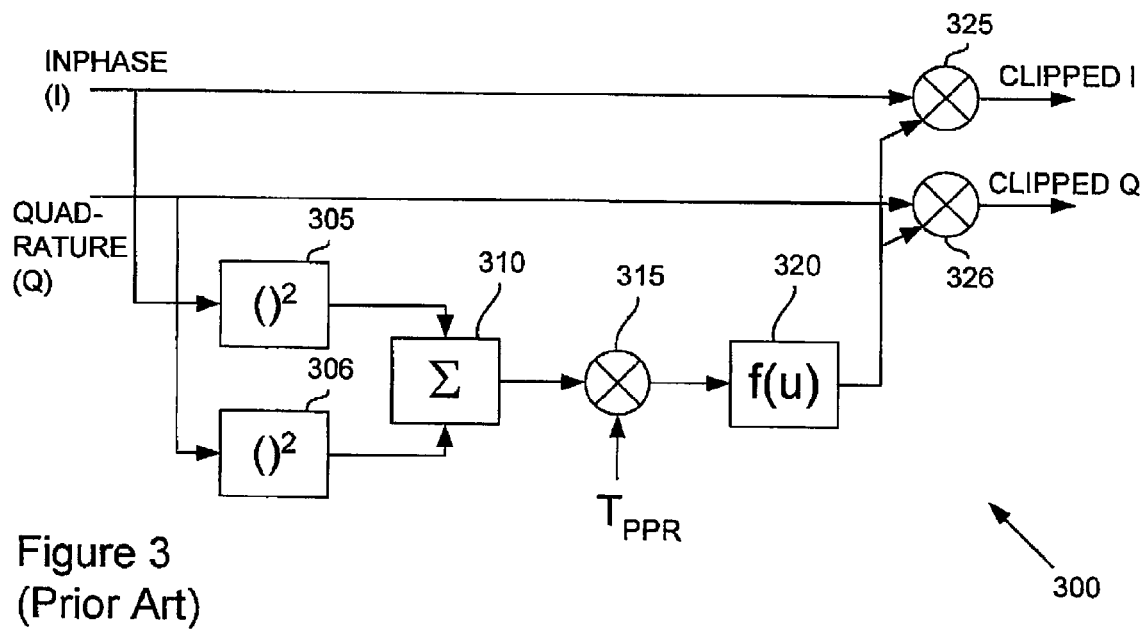
FIG. 3 illustrates a prior art implementation of a hard clipping circuit for a communications system using baseband signaling.

Referring now to FIG. 3, the diagram illustrates a prior art implementation of a hard clipping circuit 300 for a communications system using baseband signaling. A baseband communications system uses two signal streams, for example, an in-phase stream (I) and a quadrature-phase stream (Q), to represent the overall data stream. The two signal streams are processed together and are eventually combined to produce the single data stream. Alternatively, the system could operate at an intermediate frequency (IF) where there would only be one data stream. Someone of ordinary skill in the art could readily adapt the baseband circuit to operate on a single IF stream.

Each of the two signal streams, the I and the Q streams, are provided to separate squaring functions 305 and 306. The squaring functions calculate the square of each sample in the respective streams. The outputs of the two squaring functions are provided to a summation unit 310 that calculates the value $I^2+Q^2$, otherwise known as the instantaneous power of the data stream. The instantaneous power of the data stream, the output of the summation unit 310, is then multiplied with a scaling value, for example, $T_{PPR}$, by a multiplier 315. The multiplication with the scaling value scales the instantaneous power so that the threshold is at 0 dB. The scaling value may be thought of as having an inverse relationship with the threshold. This can have the result of simplifying the design of the function used to clip the I and Q streams. The clipping function is applied to the scaled instantaneous power in a functional unit 320. With the instantaneous power scaled so that a power level equal to the threshold is at 0 dB, the clipping function can be implemented as a simple look-up table. An exemplary implementation of the clipping function may be described as the following mathematical expression:

$$f(u) = \begin{cases} 1 & u \le 1 \\ \dfrac{1}{\sqrt{u}} & u > 1 \end{cases},$$

where u is the instantaneous power, i.e., the input to the functional unit 320. The output of the functional unit 320 are scaling factors that are used to scale the actual I and Q streams. For example, if the instantaneous power (u) at a particular time is less than one, the I and Q values corresponding to the particular instance of u does not need to be clipped, therefore, the scaling factor is one. The scaling factors are multiplied with the individual I and Q values in a pair of multipliers 325 and 326. The output of the multipliers 325 and 326 are the clipped I and Q streams.

Since the square-root operation typically consumes a considerable number of processor cycles, the calculation of the square-root and the subsequent inverse of the result can have a severe impact on the complexity and implementation cost of the hard clipping circuit 300. It is therefore advantageous to pre-calculate and store a number of different square-roots for various values of u greater than one. However, unless the values of u are normalized or scaled (such as by multiplying by $T_{PPR}$), it would be difficult to create a look-up table due to the very large number of different possible values of u. Note that other clipping functions may be used in place of the one described mathematically above. Alternatively, a clipping circuit may be designed such that the I and Q streams are directly clipped by the clipping function, rather than determining a scaling factor and then multiplying the I and Q streams with the scaling factors.

Figure 4:
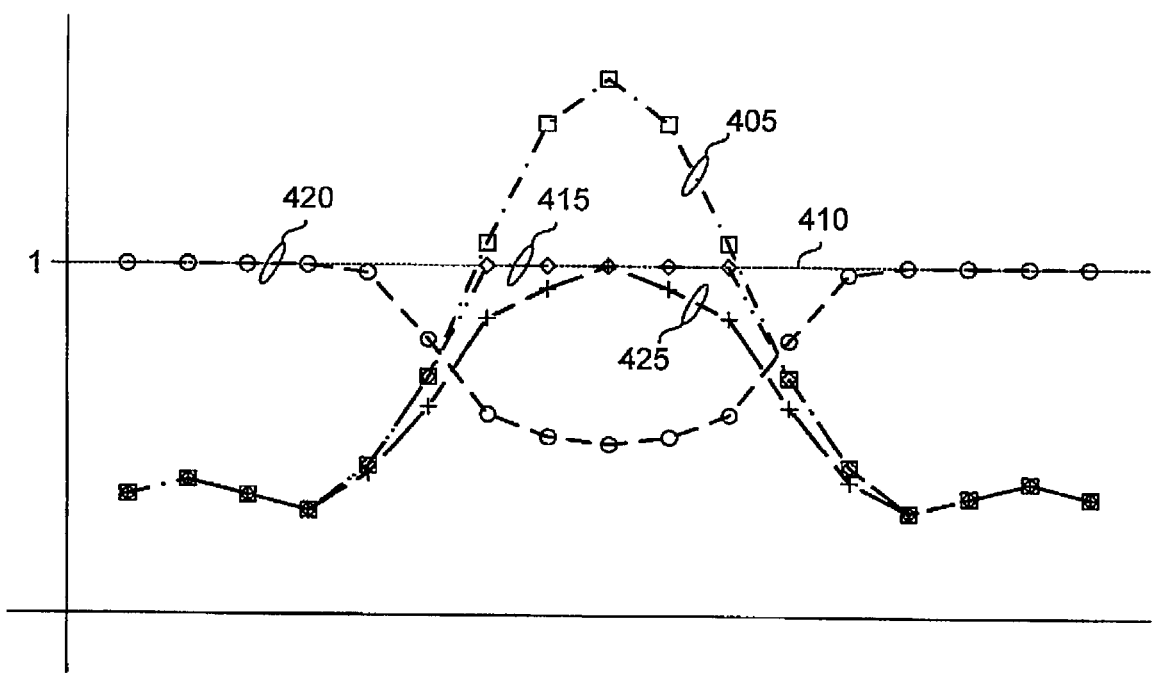
FIG. 4 illustrates an input signal, a scaling window, and two peak reduced signals according to a preferred embodiment of the present invention.

Referring now to FIG. 4, the data plot displays a set of curves representing a signal, a scaling windowing, and two peak-reduced, signals according to a preferred embodiment of the present invention. A first curve 405 with data points represented as hollow squares displays the signal prior to peak reduction. A dashed line 410 represents a threshold used to determine where a signal should be clipped. Note that the signal has been normalized and that the threshold is set at one. A second curve 415 with data points represented as hollow diamonds displays the signal (originally represented by the first curve 405) that has been peak reduced by hard clipping. A third curve 420 with data points represented as hollow circles displays the output of a windowing unit (this will be described in greater detail below). Finally, a fourth curve 425 with data points represented as crosses displays the signal (originally represented by the first curve 405) that has been peak reduced by a scaling window.

Comparing the two peak reduced curves, the second curve 415 (curve 405 peak reduced by hard clipping) and the fourth curve 425 (curve 405 peak reduced by a scaling window), it is readily evident that the fourth curve 425 more closely resembles the original signal than the second curve 415. The second curve 415 can be simply thought of as the original signal with any and all signal levels above the threshold eliminated. It is the hard corners in the second curve 415 that introduce spurious out-of-band emissions. Note that although the fourth curve 425 more closely resembles the original signal, it is not without distortion from the peak reduction operation. In fact, the magnitude of the fourth curve 425 in the vicinity of the signal peak can be significantly lower than that of the original signal. This can lead to an increased bit-error-rate and increased spurious out-of-band emissions.

The fourth curve 425 displayed a peak reduced signal that was reduced using a scaling window. It is readily evident that not only has the signal been reduced to where no part of the signal exceeds the specified threshold (line 410), but that samples representing the signal immediately adjacent to the signal peak have also been reduced in magnitude. In fact, all samples adjacent to the signal peak and lying within the scaling window are reduced to some extent, depending on the shape of the scaling window. It is this soft rounding of the signal peak and its neighboring samples that helps to reduce the spurious out-of-band emissions and peak re-growth that occurs after filtering thus allowing the faster convergence. However, the distortion of the peak's neighboring samples increases the bit-error-rate of the overall communications system.

Figure 5A:
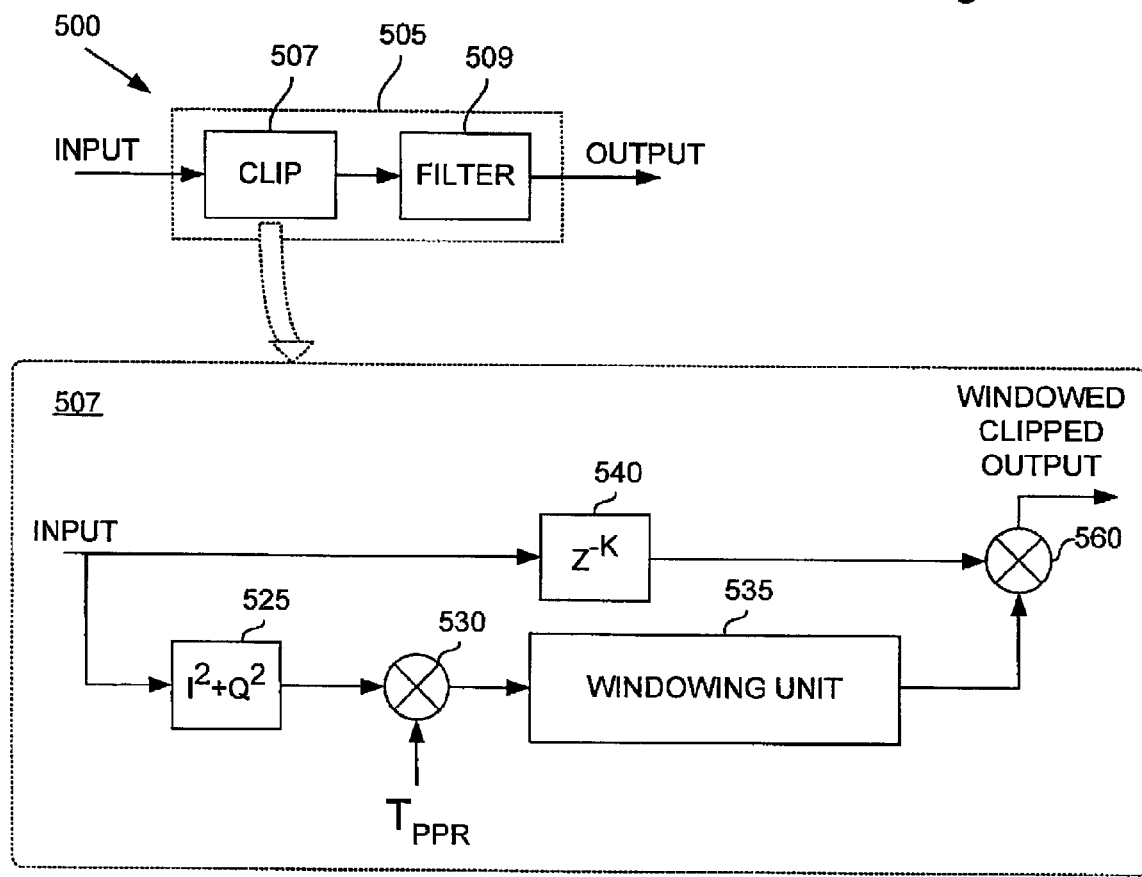
FIGS. 5a–c illustrate a peak reduction circuit, wherein the peak reduction circuit uses a windowing circuit with a windowing function and a detailed view of two embodiments of the windowing circuit according to a preferred embodiment of the present invention.

Referring now to FIG. 5a, a block diagram presents a peak reduction circuit 500 with a clip and filter circuit 505, wherein the clip and filter circuit 505 uses a clipping circuit 507 with a windowing function to perform peak reduction according to a preferred embodiment of the present invention. The clipping circuit 507 uses a windowing function to eliminate signal peaks that exceed a specified threshold. Rather than simply hard clipping the signal peaks that exceed the specified threshold, the windowing function applies a shaped scaling window to the signal peaks, resulting in a more gradual elimination of the peaks. There are many different shapes of scaling window, including, but not limited to Gaussian, Hanning, Hamming, Blackman, triangular, etc. The length of a scaling window is typically odd, to permit the placement of the midpoint of the scaling window exactly on the signal peak. The duration of a scaling window can affect the overall performance of the peak reduction circuit 500. If the scaling window is too short, then the signal peaks may not be effectively reduced, while if the scaling window is too long, then a significant number of the peak's neighbors that do not exceed the threshold are affected by the scaling window (this phenomenon can be seen in the fourth curve 425 from FIG. 4). Scaling windows and the use of windowing functions are well known by those of ordinary skill in the art of the present invention.

The peak reduction circuit 500 is similar to the peak reduction circuit 200 displayed in FIG. 2 with the exception that it has only a single clip and filter circuit. However, additional clip and filter circuits may be added in a serial fashion to the peak reduction circuit 500 to further improve the circuit's peak reducing ability.

An input signal, as received by the communications system, is provided to the peak reduction circuit 500. Note that while FIG. 5 displays the input as a single input, the input may be a dual stream input, such as would be the case if the communications system were to use baseband signaling (such as, I and Q signal streams). As displayed in FIG. 5, the peak reduction circuit 500 is operable with an input with either one or two signal streams. However, with a few minor modifications, the peak reduction circuit 500 can be extended to operate with an input with more than two signal streams. The input is then provided to the clip and filter circuit 505, which produces as output, a clipped and filtered signal.

Examining the clipping circuit 507 in greater detail, the input is provided to a signal power calculator 525, which calculates the instantaneous power of the input by simply squaring the input (or each signal stream if there is more than one and adding them together). The instantaneous power of the input (the output of the signal power calculator 525) is then multiplied by a scaling value, for example, $T_{PPR}$, by a multiplier 530. There is an inverse relationship between the threshold and the scaling value. As discussed previously, the multiplication of the instantaneous power of the input by the scaling value has the effect of normalizing the instantaneous power of the input to the threshold, simplifying subsequent calculations. However, the normalization step is not necessary for the proper operation of a preferred embodiment of the present invention. The normalized instantaneous power of the input is then provided to a windowing unit 535. The windowing unit 535 detects the presence of a signal peak that exceeds the threshold (now normalized to unity) and then provides scaling factor that are used to scale the input signal. Alternatively, a windowing unit can be devised that performs the actual scaling of the input signal rather than just the scaling factors that are subsequently applied to the input signal. In parallel with the signal power calculator 525, multiplier 530, and the windowing unit 535 is a delay 540. The delay 540 inserts a delay that is equal to one half the length of the scaling window, i.e., the delay is equal to (L−1)/2 where L is the length of the scaling window (normally in the number of samples and of an odd length, additional delay may also be required to account for the latency, if any, of the instantaneous power calculation and threshold scaling functions). The delay permits the peak to be centered in the middle of the scaling window once a peak has been detected.

Figure 5B:
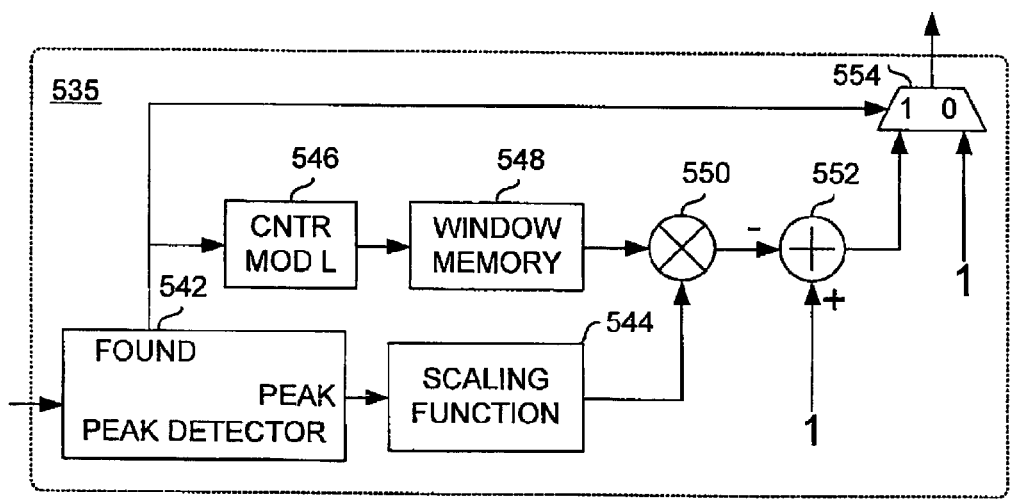

Referring now to FIG. 5b, a block diagram illustrates a detailed view of a windowing unit 535 according to a preferred embodiment of the present invention. The windowing unit 535 is used to detect the presence of a signal peak with a magnitude above the threshold and then to calculate the appropriate scaling factors for use in peak reduction by the multiplier 560 (FIG. 5a). As discussed previously, a windowing unit can be designed so that it would have as an input the input signal and output a peak reduced version of the input signal. The windowing unit 535 includes a peak detector 542 whose purpose is to locate local peaks with magnitudes exceeding the threshold (commonly referred to as local maxima). According to a preferred embodiment of the present invention, a local peak in a signal stream is defined as a signal value that is surrounded by adjacent signal values that are smaller in magnitude than itself.

When the peak detector 542 detects a signal peak, it asserts two signals. A first signal being a "FOUND" signal and a second signal being a "PEAK" signal. The FOUND signal signifies that the peak detector 542 has found a signal peak and that the peak reduction circuitry should begin operation, while the PEAK signal carries the normalized magnitude of the signal peak. According to a preferred embodiment of the present invention, the PEAK signal is maintained for the entire duration of the windowing operation, the FOUND signal should also be asserted for the duration of the windowing operation as well.

The magnitude of the signal peak (carried on the PEAK signal) is provided to a scaling function unit 544. The scaling function unit 544 uses the magnitude of the signal peak provided to it by the peak detector 542 to determine the amount of scaling that needs to be performed. According to a preferred embodiment of the present invention, the amount of scaling, $f_w(\text{peak})$, is a function of the signal peak and can be expressed as a mathematical expression:

$$f_w(\text{peak}) = 1 - \frac{1}{\sqrt{\text{peak}}},$$

where peak is the magnitude of the signal peak. Once again, with the input signal normalized by the multiplication with the specified threshold, $T_{PPR}$, by the multiplier 530, the scaling function can be implemented as a look-up table to reduce the amount of computation needed by the scaling function unit 544. Note that the scaling function unit 544 will maintain a single scaling factor that is a function of the signal peak for the entire duration of the window.

The FOUND signal signifies that the peak detector 542 has found a signal peak and that the peak reduction circuitry should start operating. The assertion of the FOUND signal initiates the operation of a counter 546. The counter 546 counts modulo L (the length of the scaling window) and is used to generate an index into a window memory 548. The window memory 548 is used to store the actual window. For example, if the window is a Gaussian window, the window memory 548 would store the description of a Gaussian window in its memory, with the Gaussian window scaled such that the peak of the window is unity. For a single index provided by the counter 546, the window memory 548 provides a corresponding value of the window. For example, let the window be 11 samples long, then the counter 546 will provide a number between zero and 10 and the window memory 548 will provide the particular sample of the window corresponding to the index provided by the counter 546.

The samples of the window provided by the window memory 548 are then multiplied with the scaling value provided by the scaling function unit 544 with a multiplier 550. All of the window samples provided by the window memory 548 are multiplied by the same scaling factor, one window sample at a time. After being multiplied by the scaling factor, the scaled window sample is subtracted from a constant value, preferably the number one, at a summing point 552. The output of the summing point 552 is then multiplied with the input signal at a multiplier 560. A multiplexer 554, controlled by the FOUND signal ensures that the input signal is not modified unless a signal peak has been found by the peak detector 542. The actual peak reduction being applied to the signal peak can be expressed as:

$$w_r = 1 - \text{window(index)}\left(1 - \frac{1}{\sqrt{\text{peak}}}\right),$$

where index is the index provided by the counter 546 and peak is the signal peak provided by the peak detector 542.

Figure 5C:
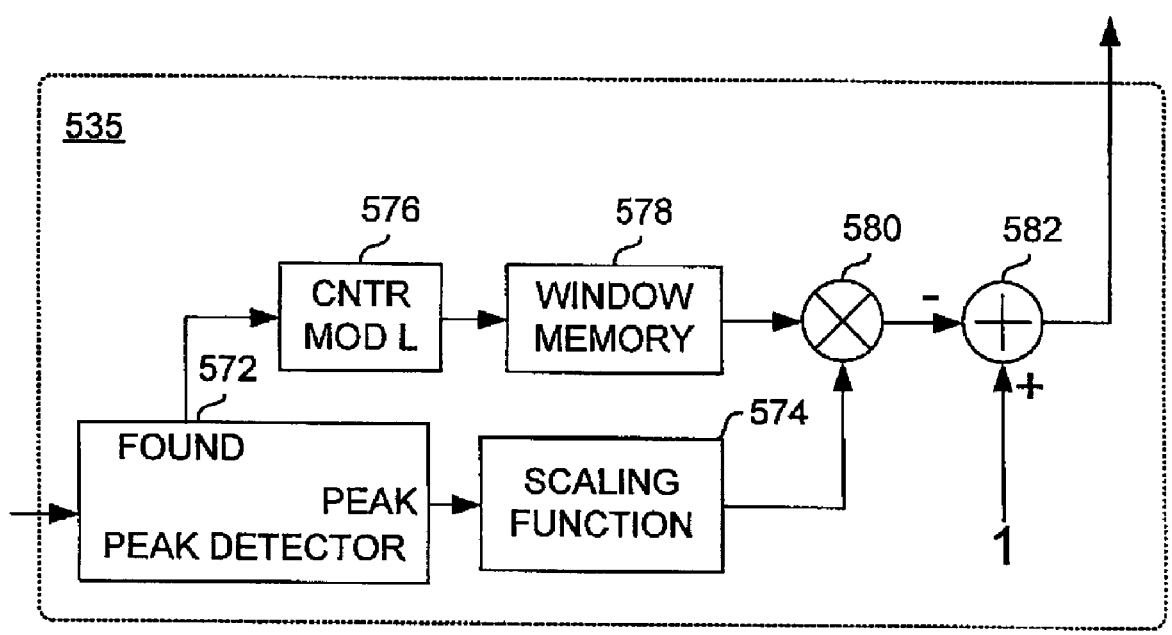

Referring now to FIG. 5c, a block diagram illustrates an alternate preferred implementation of a windowing unit 535 according to a preferred embodiment of the present invention. The embodiment displayed in FIG. 5c does not use a multiplexer, such as the multiplexer 554 (FIG. 5b), used to provide a "1" value when a peak has not been found and to provide the peak reduction scaling value when a peak has been found.

In order to support the removal of the multiplexer, a peak detector 572 is modified from the peak detector 542 (FIG. 5b) so that when it has not detected a peak, it would output a specified value out its PEAK signal, preferably a "zero" or a "negative infinity" value, i.e., some value that is unlikely to occur. Then, a scaling function 574 would detect that the specified value is on the PEAK signal and output a zero itself. Alternatively, the scaling function 574 can be configured such that whenever a "zero" is placed at its input, it will automatically output a "zero" value of its own. Therefore, no detection is required. Regardless of the implementation of the scaling function 574, the zero value that it produces would be multiplied with an output of a window memory 578 in a multiplier 580. Therefore, independent of the value of the output of the window memory 578, the output of the multiplier 580 will be zero.

With the output of the multiplier 580 being zero, then a summing point 582 would produce a required "one" value since it implements the mathematical expression 1−0=1. When the peak detector 572 detects a peak, it is preferred that it asserts a value equal to the magnitude of the detected peak out its PEAK signal line and the windowing unit 535 would operate in a fashion similar to the windowing unit described in FIG. 5b.

The behavior of a CDMA signal is such that it is very possible (if not highly likely) to have more than one signal peak exceeding a specified threshold within a single scaling window length (for scaling windows of useful length). The windowed peak reduction circuit displayed in FIG. 5b would be able to detect the presence of one such signal peak within a single scaling window and would not be able to detect any subsequent signal peaks if they appear within the same scaling window interval. For example, if the peak detector 542 (FIG. 5b) detects a signal peak and the remainder of the clipping circuit 507 (FIG. 5a) centers a scaling window around the detected peak, then the peak detector 542 as it is designed will not be able to detect any other signal peak if one should occur prior to the completion of the application of the scaling window.

It is possible to serially connect additional clip and filter circuits to detect the presence of signal peaks missed by earlier clip and filter circuits. However, the peak re-growth that occurs during the filtering portion of the clip and filter circuit may cause the continued miss detection of subsequent signal peaks that occur within one scaling window's duration of a detected signal peak. Therefore, the sequential addition of clip and filter circuits may not be an optimal way to solve the problem of multiple signal peaks occurring within one scaling window's duration of one another.

Another problem presented by sequentially chaining clip and filter circuits, is that a significant amount of latency can be added to the communications system. The latency is due mainly to the additional filter circuits in the clip and filter circuits.

Figure 6:
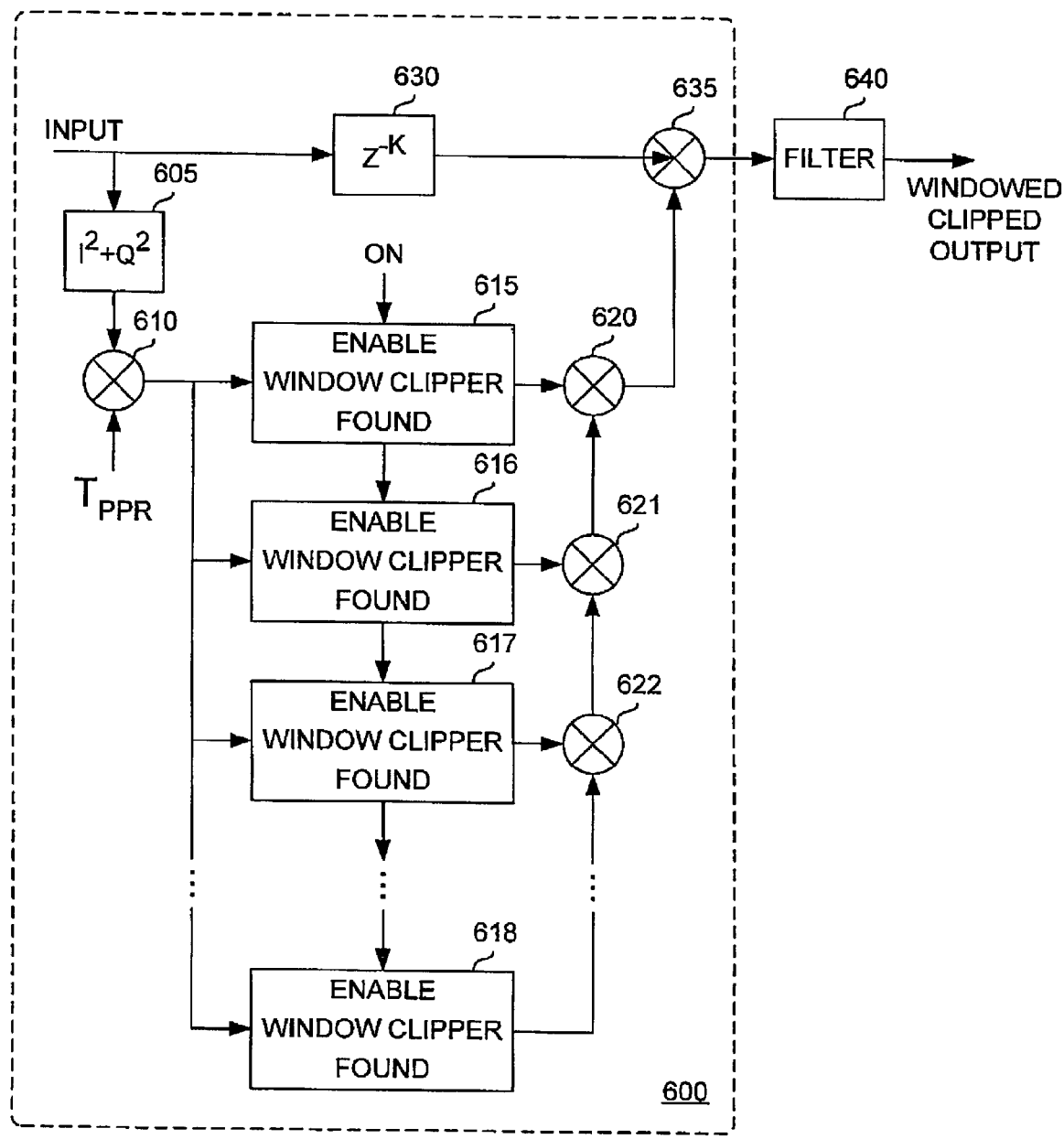
FIG. 6 illustrates a peak reduction circuit, wherein the peak reduction circuit uses a windowing circuit with a parallel cascade of windowing functions and can detect and reduce several signal peaks that occur within a scaling window's duration of a first detected signal peak according to a preferred embodiment of the present invention.

Referring now to FIG. 6, the block diagram illustrates a detailed view of a clipping circuit 600 that makes use of a scaling window and can detect and reduce a plurality of signal peaks within a single scaling window interval according to a preferred embodiment of the present invention. The clipping circuit 600 is an extension of the clipping circuit 507 displayed in FIG. 5a. It was noted previously that the clipping circuit 507 would not be able to detect any other signal peaks if they happen to occur within one scaling window's duration after the detection of the first signal peak. This is due to the requirement that the peak detector 542 (FIG. 5b) asserts and maintains the FOUND signal line for an entire scaling window's duration.

Rather than chaining the clip and filter circuits sequentially, it is possible to cascade a plurality of windowing units inside a single clip and filter circuit. FIG. 6 displays at least four windowing units (615, 616, 617, and 618) connected in parallel and replacing what would have been a single clipping circuit (as displayed in FIG. 5a). Each of the windowing units has an additional input referred to as an ENABLE input. The ENABLE input is used to turn on the windowing unit when the ENABLE input is asserted and with the ENABLE not asserted, the windowing unit is not turned on. As displayed in FIG. 6, the windowing unit 615 is always turned on (due to its ENABLE input being asserted "ON"). The windowing unit 615 functions as a first windowing unit in the clipping circuit 600, continually checking the input signal for the occurrence of a signal peak exceeding the specified threshold.

When the windowing unit 615 finds a signal peak that exceeds the specified threshold, it begins the windowing operation to reduce the signal peak as described in FIG. 5a. When the FOUND signal line is asserted by the windowing unit 615, it enables the ENABLE input on the second windowing unit 616. As discussed earlier, once a windowing unit finds a signal peak, it discontinues its search for other signal peaks until it has completed the windowing operation. Therefore, according to a preferred embodiment of the present invention, another windowing unit takes over the task of detecting signal peaks exceeding the specified threshold. This continues until a period of time equal to the duration of the scaling window expires after the detection of the first signal peak (i.e., the application of the scaling window to the first signal peak is complete) or until all available windowing units have found signal peaks.

The second windowing unit 616, with its ENABLE input asserted, monitors the input signal for signal peaks exceeding the specified threshold. Because the second windowing unit 616 operates independently of the first windowing unit 615, the second windowing unit 616 may be able to find a signal peak as soon as two signal samples after the initial signal peak. The cascade of windowing units continues until the first windowing unit 615 completes its windowing operation. Once the first windowing unit 615 completes its windowing operation, it no longer asserts the FOUND signal line, disabling the second windowing unit 616 (and any other active windowing unit activated by the second windowing unit 616, and returns to its task of monitoring the input signal. Although the second windowing unit 616 (and any other active windowing units) is no longer activated, it is configured to continue with the application of the scaling window to its respective signal peak until the operation is complete.

The scaling factors produced by each of the active windowing units are multiplied together (in multipliers such as 620, 621, and 622) to produce a single scaling factor that is multiplied with a delayed version of the input signal by a multiplier 635. The input signal is delayed in a delay block 630 with a delay-that is preferably equal to one half of the duration of a scaling window (additional delay may also be required to account for the latency, if any, of the instantaneous power calculation and threshold scaling functions). Finally, the output of the multiplier 635 (the output of the clipping circuit 600) may be provided to a filtering unit 640 to filter any spurious out-of-band emissions produced by the windowing operation. Note that the filtering unit 640 is not a part of the clipping circuit 600 and that the output of the multiplier 635 may instead be provided to a second clipping circuit (not shown).

Figure 7:
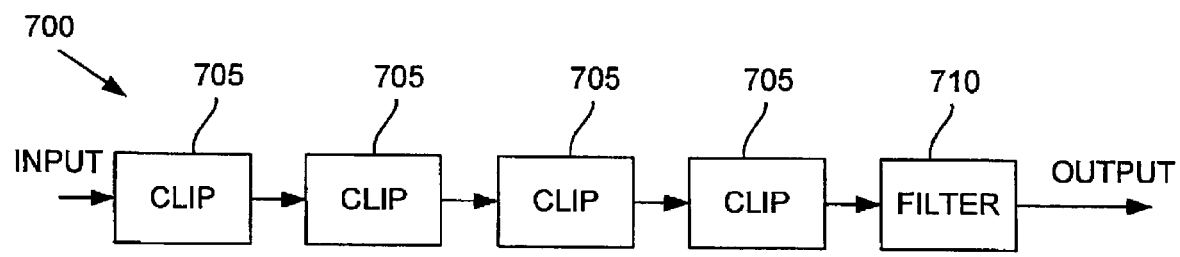
FIG. 7 illustrates a peak reduction circuit, wherein the peak reduction circuit uses a sequential cascade of window clipping circuits that can detect and reduce several signal peaks that occur within a scaling window's duration of a first detected signal peak according to a preferred embodiment of the present invention.

Referring now to FIG. 7, the block diagram illustrates a clip and filter circuit 700 featuring a sequential cascade of clipping circuits 705 that are capable of detecting and clipping a series of signal peaks occurring with a single scaling window's duration according to a preferred embodiment of the present invention. Note that each of the clipping circuits 705 is a fully functional clipping circuit, comparable to the clipping circuit 507 displayed in FIGS. 5a. While it was discussed earlier that if clip and filter circuits were cascaded serially, there may be a problem with peak re-growth that can prevent a signal peak that occurs within one scaling window's duration from another signal peak from being detected, the sequential cascade as illustrated in FIG. 7 does not suffer from this problem because there is no filtering unit between each individual clipping circuit. Therefore, peak re-growth is not a problem.

Figure 8:
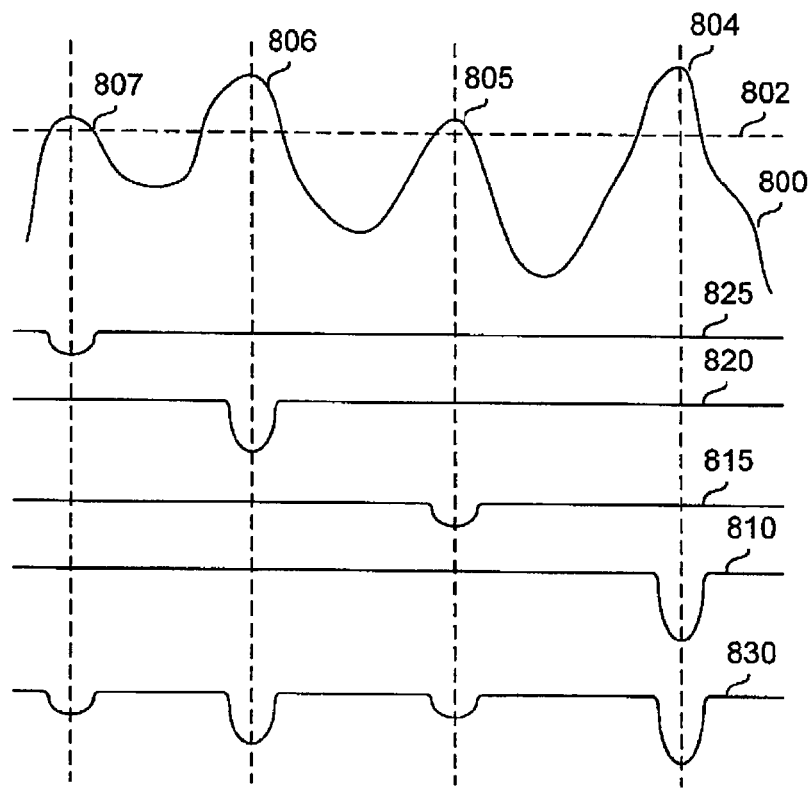
FIG. 8 illustrates an input signal with a plurality of signal peaks and a set of respective scaling windows that have been adjusted according to the magnitudes of the signal peaks and a composite scaling window according to a preferred embodiment of the present invention.

Referring now to FIG. 8, the graph displays an input signal 800 with a series of signal peaks (for example, peaks 804 and 805), each exceeding a specified threshold (the specified threshold is displayed as a dashed horizontal line 802), a series curves of scaling factors (810, 815, 820, and 825) produced by different windowing units (each scaling factor is for a separate signal peak), and a composite scaling factor curve 830 that combines each of the different scaling factors used to scale the input signal according to a preferred embodiment of the present invention. As displayed, the input signal 800 has four signal peaks (804, 805, 806, and 807) with magnitudes that exceed the specified threshold. Note that the signal peaks as displayed do not lie within a scaling window's duration of each other. The signal peaks are displayed in such a fashion to simplify the illustration. The present invention is capable of detecting and eliminating signal peaks that are as close as two samples of one another.

The first scaling factor curve 810 represents the output of a first windowing unit (for example, windowing unit 615 from FIG. 6). The first scaling factor curve 810 would be multiplied with the input signal to eliminate the peak 804 from the input signal 800. The remaining scaling factor curves (815, 820, and 825) represent the outputs of a second, third and fourth windowing units. Note that if a peak reduction circuit does not have four windowing units (for example, if it only has three windowing units), then the fourth signal peak 807 would not be eliminated, if the fourth signal peak 807 were to occur less than one scaling window's duration from the occurrence of the first signal peak 804.

The composite scaling factor curve 830 is the result of the product of each of the four individual scaling factor curves (810, 815, 820, and 825). The composite scaling factor curve 830 would be an input to the multiplier (for example, multiplier 635 (FIG. 6)) that multiplies the input signal with the composite scaling factor. If there were only one signal peak within a single scaling window's duration, then the input to the multiplier (for example, multiplier 635 (FIG. 6)) would be equal to the output of the first windowing unit (for example windowing unit 615 (FIG. 6)).

As discussed previously, a principle advantage of a preferred embodiment of the present invention is that it offers comparable performance to a hard clip and filter peak reduction circuit with a smaller number of iterations and less hardware. Simulations and experiments with actual implementations of a preferred embodiment of the scaling window peak reduction circuit show that a scaling window peak reduction circuit with a single scaling window stage (such as one displayed in FIG. 5a with support for multiple signal peaks within a single scaling window's duration) performs similarly to a hard clipped peak reduction circuit with two clip and filter circuits (such as one displayed in FIG. 2). Additionally, a scaling window peak reduction circuit with two scaling window stages performs similarly to a hard clipped peak reduction circuit with four clip and filter circuits. The use of four clip and filter circuits could introduce a significant amount of latency into the communications system, due mainly to the latency introduced by each of the four filter units and a significant amount of additional implementation complexity.

Comparing the implementation complexity of a preferred embodiment of the present invention with a baseline peak reduction circuit with two hard clip and filter circuits, a preferred embodiment with a single windowing unit incurs an additional cost of approximately 3.2 percent and a preferred embodiment with two windowing units incurs an additional cost of approximately 7.2 percent over the baseline circuit. The implementation of a preferred embodiment of the present invention with two windowing units incur a slight cost increase over the baseline circuit with two hard clip and filter circuits while offering the peak reduction performance of a circuit with four hard clip and filter circuits without the added latency.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for peak power reduction comprising:
measuring an input signal;
detecting a signal peak with a magnitude exceeding a specified threshold;
centering a scaling window on the detected signal peak;

adjusting the scaling window based on a magnitude of the detected signal peak, wherein the scaling window is adjusted according to the following expression:

$$\text{adjusted\_scaling\_window} = \text{scaling\_window}\left(1 - \frac{1}{\sqrt{\text{peak\_mag}}}\right)$$

wherein peak mag is the magnitude of the detected signal peak; and multiplying the detected signal peak with the adjusted scaling window to reduce the detected signal peak in the input signal via the scaling window.

2. The method of claim 1, wherein the reducing step further comprises the step of normalizing the specified threshold to 1 prior to the adjusting step.

3. The method of claim 1, wherein the detected signal peak is at or near a local maximum.

4. The method of claim 1, wherein the scaling window has an odd number of samples.

5. The method of claim 4, wherein the scaling window is a Gaussian scaling window.

6. The method of claim 4, wherein the scaling window is a Hanning scaling window.

7. The method of claim 4, wherein the scaling window is a Hamming scaling window.

8. The method of claim 1, further comprising filtering the peak reduced input signal.

9. A circuit comprising:
a peak detector having an input coupled to a signal input line, the peak detector containing circuitry to detect signal peaks exceeding a specified threshold;
a scaling window adjustor circuit having an input coupled to the peak detector, the scaling window adjustor circuit containing circuitry to adjust a scaling window based on a signal peak magnitude provided by the peak detector, wherein the scaling window adjustor circuit comprises:
a window scaling function unit coupled to the peak detector, the window scaling function unit containing circuitry to compute a scaling window adjust factor based on the signal peak magnitude provided by the peak detector;
a counter coupled to a second output of the peak detector, the counter to count a specified interval that is a function of a length of the scaling window;
a memory coupled to the counter, the memory to store the scaling window; and
a multiplier having a first input coupled to the window scaling function unit and a second input coupled to the memory, the multiplier to multiply the scaling window with the window adjust factor; and
an output to provide the adjusted scaling window.

10. The circuit of claim 9, wherein the peak detector detects localized signal peaks that exceed the specified threshold.

11. The circuit of claim 9, further comprising a summing block coupled to the multiplier, the summing block to subtract the output of the multiplier from a fixed value, one.

12. The circuit of claim 9, wherein a scaling window adjust factor is computed using the following mathematical expression:

$$1 - \frac{1}{\sqrt{\text{peak\_mag}}}$$

wherein peak_mag is the signal peak magnitude provided by the peak detector.

13. The circuit of claim 9, wherein the specified interval is an interval specified as [0, Scaling_Window_Length−1], where Scaling_Window_Length is the length of the scaling window.

14. The circuit of claim 9, wherein the specified interval is an interval specified as [1, Scaling_Window_Length], where Scaling_Window_Length is the length of the scaling window.

15. The circuit of claim 9, wherein the circuit outputs the adjusted scaling window only when the peak detector detects a signal peak exceeding the specified threshold.

16. The circuit of claim 15, wherein the circuit outputs a one (1) value at all other times.

17. A peak reduction circuit comprising:
a signal power calculator coupled to a signal input, the signal power calculator containing circuitry to determine a signal power from an input signal;
a window clipper unit coupled to the signal power calculator, the window clipper unit containing circuitry to detect signal peaks with magnitudes exceeding a specified threshold and to provide an adjusted scaling window based on the magnitudes;
a multiplier coupled to the signal input and the window clipper unit, the multiplier to produce a peak reduced signal by multiplying the signal input with the adjusted scaling window;
a second window clipper unit, the second window clipper unit coupled to the signal power calculator and the enable input coupled to the first window clipper unit, wherein the second window clipper unit is turned on after the first window clipper unit detects a signal peak exceeding the specified threshold;
a second multiplier having a first input coupled to the window clipper unit and a second input coupled to the second window clipper unit, the second multiplier to produce a composite adjusted scaling window by multiplying the outputs of the window clipper units; and
a filter unit coupled to the second multiplier.

18. The peak reduction circuit of claim 17 further comprising a normalizer having an input coupled to the signal power calculator and an output coupled to the window clipper unit, the normalizer containing circuitry to adjust a power level in the input signal equal to the specified threshold equal to one.

19. The peak reduction circuit of claim 17 further comprising a delay unit having an input coupled to the signal input and an output coupled to the multiplier, the delay unit to insert a delay that is a function of a duration of a scaling window.

20. The peak reduction circuit of claim 17 wherein the filter unit is configured to-filter the peak reduced signal to eliminate spurious emissions.

21. The peak reduction circuit of claim 19, wherein the delay is a function of the duration of the scaling window plus a function of additional mathematical computations.

22. The peak reduction circuit of claim 21, wherein the additional mathematical computations include an instantaneous power and a threshold scaling computations.

23. The peak reduction circuit of claim 19, wherein the delay is approximately equal to one half the duration of the scaling window.

24. The peak reduction circuit of claim 19, wherein the window clipper unit further comprises an enable input, the enable input turns the window clipper unit on and off.

25. The peak reduction circuit of claim 24, wherein the enable input of the window clipper unit is always on.

26. The peak reduction circuit of claim 17, wherein when the window clipper unit completes its task of providing an adjusted scaling window, the window clipper unit turns off the second window clipper unit, unless the second window clipper unit is actively providing an adjusted scaling window of its own.

27. A peak reduction circuit comprising:
 a signal power calculator coupled to a signal input, the signal power calculator containing circuitry to determine a signal power from an input signal;
 a window clipper unit coupled to the signal power calculator, the window clipper unit containing circuitry to detect signal peaks with magnitudes exceeding a specified threshold and to provide an adjusted scaling window based on the magnitudes;
 a multiplier coupled to the signal input and the window clipper unit, the multiplier to produce a peak reduced signal by multiplying the signal input with the adjusted scaling window; and
 a clipping unit having an input coupled to the output of the multiplier and an output coupled to the filter unit, the clipping unit comprising:
  a second signal power calculator coupled to the output of the multiplier, the second signal power calculator containing circuitry to determine a second signal power from the output of the multiplier;
  a second window clipper unit coupled to the second signal power calculator, the second window clipper unit containing circuitry to detect signal peaks with magnitudes exceeding a specified threshold and to provide a second adjusted scaling window based on the magnitudes;
  a second multiplier coupled to the output of the multiplier and the second window clipper unit, the second multiplier to produce a peak reduced signal by multiplying the output of the multiplier with the second adjusted scaling window.

28. The peak reduction circuit of claim 27 further comprising a second delay unit having an input coupled to the output of the multiplier and an output coupled to the second multiplier, the second delay unit to insert a delay equal to one half a duration of a scaling window.

29. The peak reduction circuit of claim 27, further comprising a filter unit coupled to the multiplier, the filter unit to filter the peak reduced signal to eliminate spurious emissions.

30. The peak reduction circuit of claim 27, wherein the window clipper unit further comprises an enable input, the enable input turns the window clipper unit on and off.

31. The method of claim 29, wherein after the filtering step, the method further comprises the steps of:
 measuring the peak reduced input signal;
 detecting a signal peak with a magnitude exceeding a specified threshold;
 reducing the detected signal peak in the input signal via a scaling window; and
 filtering the peak reduced input signal to eliminate spurious out-of-band emissions.

32. The method of claim 29, wherein the input signal is a baseband signal and the filtering step is performed by a low-pass filter.

33. The method of claim 29, wherein the input signal is a baseband signal and the filtering step is performed by a band-pass filter.

34. The method of claim 29, wherein the input signal is an intermediate frequency signal and the filtering is performed by a band-pass filter.

* * * * *